US012638479B2

(12) United States Patent
Chen et al.

(10) Patent No.: US 12,638,479 B2
(45) Date of Patent: May 26, 2026

(54) PEAK DETECTING CIRCUIT FOR AN INPUT VOLTAGE AND ASSOCIATED METHOD

(71) Applicant: Chengdu Monolithic Power Systems Co., Ltd., Chengdu (CN)

(72) Inventors: Yuedong Chen, Chengdu (CN); Junhong Li, Chengdu (CN); Jiangwei Cheng, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 914 days.

(21) Appl. No.: 17/696,520

(22) Filed: Mar. 16, 2022

(65) Prior Publication Data

US 2022/0299546 A1 Sep. 22, 2022

(30) Foreign Application Priority Data

Mar. 22, 2021 (CN) .......................... 202110304718.X

(51) Int. Cl.
*G01R 19/04* (2006.01)
*H02M 1/00* (2007.01)
*H02M 1/42* (2007.01)

(52) U.S. Cl.
CPC .......... *G01R 19/04* (2013.01); *H02M 1/0022* (2021.05); *H02M 1/4225* (2013.01); *H02M 1/4266* (2013.01)

(58) Field of Classification Search
CPC . G01R 19/04; G01R 19/0084; H02M 1/0022; H02M 1/4225; H02M 1/4266
See application file for complete search history.

(56) References Cited

U.S. PATENT DOCUMENTS

| | | | | |
|---|---|---|---|---|
| 9,444,327 B2 | 9/2016 | Lin | | |
| 10,826,385 B2 * | 11/2020 | Kim | .......................... | H02M 7/06 |
| 2006/0062031 A1 * | 3/2006 | Kim | ........................... | G05F 1/70 |
| | | | | 363/89 |
| 2006/0087298 A1 * | 4/2006 | Turchi | ................. | H02M 1/4225 |
| | | | | 323/265 |
| 2011/0102950 A1 * | 5/2011 | Park | ..................... | H02M 1/4225 |
| | | | | 361/18 |
| 2015/0062985 A1 * | 3/2015 | Colbeck | .............. | H02M 1/4225 |
| | | | | 363/89 |
| 2015/0303790 A1 * | 10/2015 | Lin | ...................... | H02M 1/4225 |
| | | | | 363/89 |
| 2015/0364988 A1 * | 12/2015 | Lu | ........................ | H02M 1/4208 |
| | | | | 363/84 |
| 2016/0111970 A1 * | 4/2016 | Nate | .................... | H02M 1/4225 |
| | | | | 315/201 |
| 2016/0218624 A1 * | 7/2016 | Ishizeki | .............. | H02M 1/4225 |
| 2016/0241134 A1 * | 8/2016 | Maruyama | .......... | H02M 1/4225 |

* cited by examiner

*Primary Examiner* — Huy Q Phan
*Assistant Examiner* — Haidong Zhang
(74) *Attorney, Agent, or Firm* — Perkins Coie LLP

(57) ABSTRACT

A method for detecting a variation of input voltage. The method is generating an indication signal based on the input voltage, and comparing the input voltage with a first reference signal. The first reference signal is smaller than the indication signal, and if the input voltage is consistently smaller than the first reference signal during a first time duration from the moment when the input voltage is decreased to the first reference signal, the indication signal is decreased after the first time duration.

12 Claims, 8 Drawing Sheets

PEAK DETECTING CIRCUIIT FOR AN INPUT VOLTAGE AND ASSOCIATED METHOD

CROSS-REFERENCE TO RELATED APPLICATIONS

This application claims the benefit of Chinese Patent Application No. 202110304718.X, filed on Mar. 22, 2021, which is incorporated herein by reference in its entirety.

TECHNICAL FIELD

This disclosure generally relates to a detecting circuit, and more particularly but not exclusively relates to a peak detecting circuit.

BACKGROUND

A blanking circuit is usually designed in a power factor correction circuit to eliminate the effect raised by a variation of an input voltage, so that the power factor correction circuit can provide a constant output power when the input voltage varies. Therefore, a peak detecting circuit which can detect a peak value of the input voltage in real time and feedback the variation of the input voltage quickly is required. However, existing detecting circuit either has a slow response time or a poor stability, i.e., when there is a small disturbance in the input voltage, it may be identified as a real decrease or increase of the input voltage by mistake.

Therefore, it is desired to design a detecting circuit to detect and identified the variation of the input voltage fast with no take.

SUMMARY

In accomplishing the above and other objects, the present invention provides a method for detecting an input voltage, wherein the input voltage has a period and has a peak value at each period. The method comprises generating an indication signal based on the input voltage, generating a first reference signal based on the indication signal, and comparing the input voltage with the first reference signal. The method further comprises decreasing the indication signal if the input voltage is smaller than the first reference signal during a first time duration from the moment when the input voltage is decreased to the first reference signal. Wherein the indication signal has a first value indicating the peak value of the input voltage during a sampling interval, and the sampling interval is equal to the period of the input voltage. Wherein the first time duration is longer than twice of the period of the input voltage.

The present invention provides a method for detecting an input voltage, wherein the input voltage has a period and has a peak value at each period, the method comprises generating an indication signal based on the input voltage, and the indication signal has a first value indicating the peak value of the input voltage during a sampling interval. The method further comprises generating a first reference signal and a second reference signal based on the indication signal, wherein the first reference signal is greater than the second reference signal. The method still comprises comparing the input voltage with the first reference signal and the second reference signal, and decreasing the indication signal if the input voltage is consistently smaller than the first reference signal and is equal to the second reference signal at any moment during a first time duration from the moment when the input voltage is decreased to the first reference signal. Wherein the first time duration is longer than twice of the period of the input voltage, the second time duration is longer than the period of the input voltage and shorter than twice of the period of the input voltage.

The present invention provides a peak detecting circuit for detecting an input voltage, wherein the input voltage has a period. The peak detecting circuit comprises a sampling and holding circuit, a first adjusting circuit and a second adjusting circuit. The sampling and holding circuit has a first terminal to receive the input voltage, a sampling and holding circuit, a second terminal to receive a first adjusting circuit, a third terminal to receive a second adjusting circuit, and an output terminal to provide an indication signal based on the input voltage, the first adjusting signal and the second adjusting signal. The first adjusting circuit is configured to receive the input voltage and a first reference signal, and to generate the first adjusting signal based on the input voltage and the first reference signal. The second adjusting circuit is configured to receive the input voltage and a second reference signal, and to generate the second adjusting signal based on the input voltage and the second reference signal. Wherein the first reference signal is smaller than the indication signal, and the second reference signal is smaller than the first reference signal.

The present invention provides a peak detecting circuit for detecting an input voltage, wherein the input voltage has a period. The peak detecting circuit comprises an addition comparator, a first comparator, a first timing circuit, a second comparator, a second timing circuit, a controllable arithmetic unit and a digital-to-analog converter. The addition comparator has a first input terminal to receive the input voltage, a second input terminal to receive an indication signal, and an output terminal to output an addition signal. The first comparator has a first input terminal to receive the input voltage, a second input terminal to receive a first reference signal, and an output terminal to provide a first enable signal, wherein the first reference signal is smaller than the indication signal. The first timing circuit is configured to receive the first enable signal and to generate a first subtraction signal based on the first enable signal. The second comparator has a first input terminal to receive the input voltage, a second input terminal to receive a second reference signal, and an output terminal to provide a second enable signal, the second reference signal is smaller than the first reference signal. The second timing circuit is configured to receive a second enable signal and to generate a second subtraction signal based on the second enable signal. The controllable arithmetic unit is configured to receive the addition signal, the first subtraction signal, the second subtraction signal and an addition clock signal, and to outputs an indication digital signal. The digital-to-analog converter is configured to receive the indication digital signal, and to generate the indication signal based on the indication digital signal.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in an embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1A:
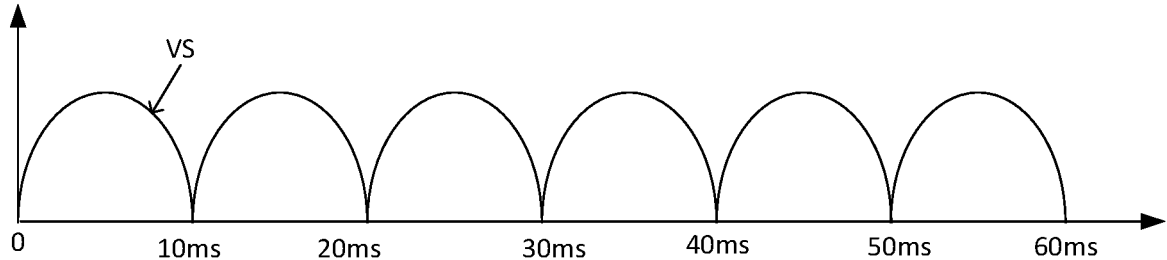
FIG. 1A illustrates a waveform diagram of a symmetrical periodic signal VS that may be theoretically and ideally provided as an input voltage of a power factor correction circuit in accordance with an embodiment of the present invention.

FIG. 1A illustrates a waveform diagram of a symmetrical periodic signal VS that may be theoretically and ideally provided as an input voltage of a power factor correction circuit in accordance with an embodiment of the present invention. Ideally, it is theoretically supposed that the state power grid may provide the symmetrical periodic signal VS having for example a period of 10 ms and a peak voltage value of 110V or 220V at each period after rectification.

Figure 1B:
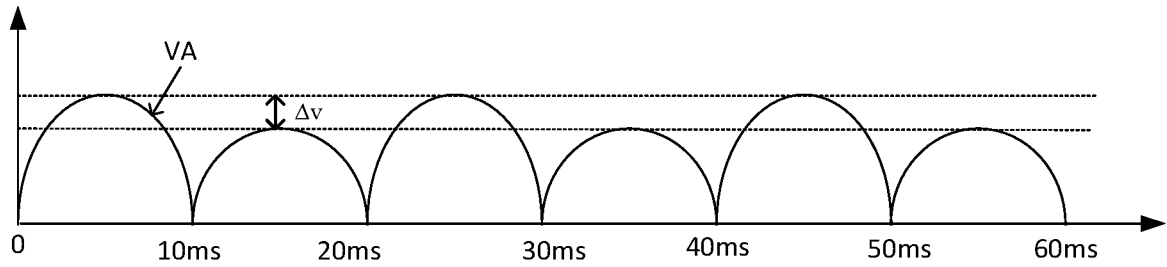
FIG. 1B illustrates a waveform diagram of an asymmetric periodic signal VA that may be provided as an input voltage of a power factor correction circuit in practical applications in accordance with an embodiment of the present invention.

However, in real applications, due to existence of disturbance in the state power grid, an asymmetric periodic signal may be generated after rectification. FIG. 1B illustrates a waveform diagram of an asymmetric periodic signal VA that may be provided as an input voltage of a power factor correction circuit in practical applications in accordance with an embodiment of the present invention. As shown in FIG. 1B, the voltage difference between two successively adjacent periods of the asymmetric periodic signal VA is defined as a disturbance value Δ V. The existence of the disturbance value □ V makes it more difficult to detect the transient variations of the asymmetric periodic signal VA quickly, so it is necessary to distinguish the disturbance from the transient of the input voltage when the input voltage varies.

Figure 2:
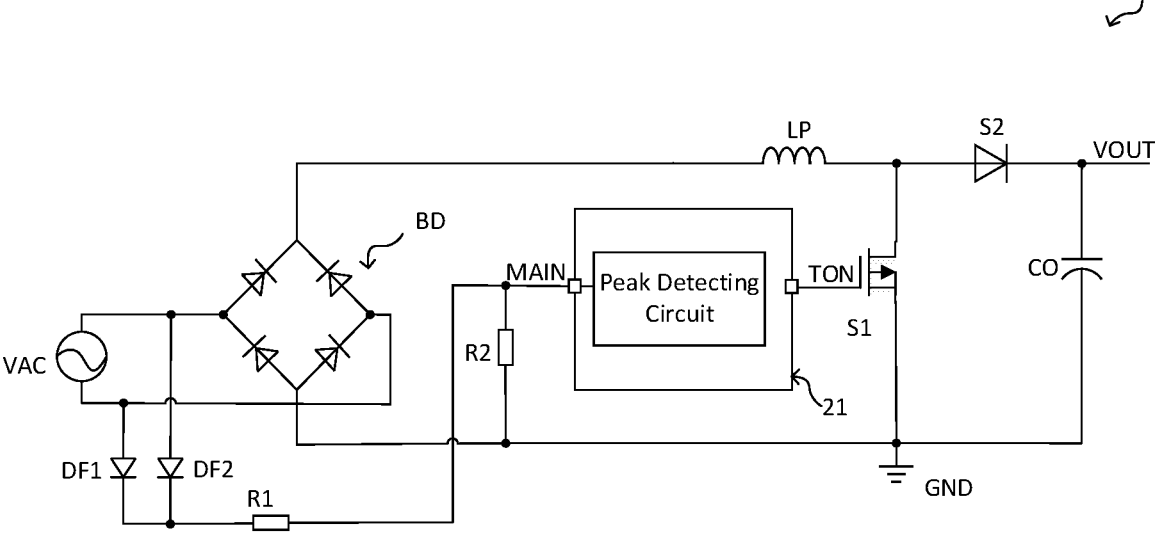
FIG. 2 illustrates a circuit diagram of a power factor correction circuit 200 with a peak detecting circuit according to an embodiment of the present invention.

FIG. 2 illustrates a circuit diagram of a power factor correction circuit 200 with a peak detecting circuit according to an embodiment of the present invention. The power factor correction circuit 200 may comprise a boost and a boost controller 21 having a peak detecting circuit, the boost may comprise an inductor LP, a first power switch 51, a second power switch S2, and an output capacitor CO. An input voltage MAIN may be generated by rectifying an AC power VAC through a rectifier bridge BD. The peak detecting circuit detects the input voltage MAIN and generates a control signal TON to control the on time of the first power switch 51 according to the input voltage MAIN. If a variation in the peak value of the input voltage MAIN can be detected and fedback fast, an on time of the first power switch 51 may be adjusted according to the variation in the peak value of the input voltage MAIN, so that the boost may have an improved stability.

Figure 3A:
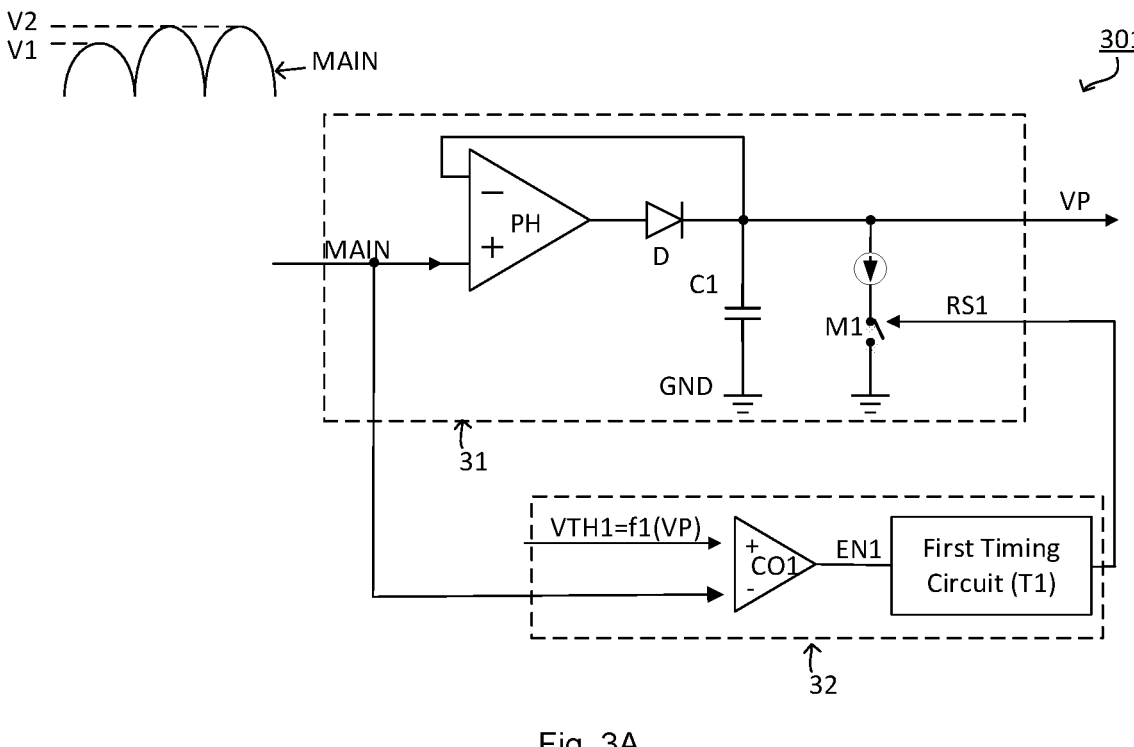
FIG. 3A illustrates a schematic circuit diagram of a peak detecting circuit 301 according to an embodiment of the present invention.

FIG. 3A illustrates a schematic circuit diagram of a peak detecting circuit 301 according to an embodiment of the present invention. The peak detecting circuit 301 may comprise a sampling and holding circuit 31 and a first adjusting circuit 32. In the embodiment shown in FIG. 3A, the input voltage MAIN is a periodic signal with a period T, the sampling and holding circuit 31 may generate an indication signal VP based on the input voltage MAIN, and the indication signal VP may have a first value V1, wherein the first value V1 is indicative of the peak value of the input voltage MAIN during a sampling interval, wherein the sampling interval may be defined as equal to the period T of the input voltage MAIN. The first adjusting circuit 32 may receive the input voltage MAIN and a first reference signal VTH1, and may generate a first adjusting signal RS1 to the sampling and holding circuit 31 to adjust the indication signal VP based on the input voltage MAIN and the first reference signal VTH1, wherein the first reference signal VTH1 is smaller than the indication signal VP. In an embodiment, the first reference signal VTH1 and the indication signal VP have a voltage difference from 5 mV to 100 mV.

In FIG. 3A, the sampling and holding circuit 31 may comprise an operational amplifier PH, a sampling diode D, a holding capacitor C1, and a controlled switch M1. Wherein the operational amplifier PH has a first input terminal to receive the input voltage MAIN, a second input terminal, and an output terminal. The sampling diode D has an anode terminal coupled to the output terminal of the operational amplifier PH and a cathode terminal coupled to the second input terminal of the operational amplifier PH and outputs the indication signal VP. The holding capacitor C1 is coupled between the cathode terminal of the sampling diode D and a reference ground GND. The controlled switch M1 is coupled between the cathode terminal of the sampling diode D and the reference ground GND, and is controlled to switch on or off to adjust the indication signal VP by the first adjusting signal RS1.

In FIG. 3A, the first adjusting circuit 32 may comprise a first comparator CO1 and a first timing circuit. The first comparator CO1 compares the input voltage MAIN with the first reference signal VTH1 and generates a first enable signal EN1 that may be provided to the first timing circuit, wherein when the input voltage MAIN is smaller than the first reference signal VTH1, the first enable signal EN1 is in a first state, and wherein when the input voltage MAIN is greater than the first reference signal VTH1, the first enable signal EN1 is in a second state. The first timing circuit receives the first enable signal EN1 and generates the first adjusting signal RS1 based on the first enable signal EN1. If the first enable signal EN1 is in the first state for a time longer than a first time duration T1, the first adjusting signal RS1 transits to the first state to turn on the controlled switch M1, and the indication signal VP is decreased, wherein first time duration T1 is longer than twice of the period T of the input voltage MAIN. If the first enable signal EN1 is in the first state for a time shorter than the first time duration T1, the first adjusting signal RS1 remains at the second state and the indication signal VP is maintained at the first value V1 or is increased depending on the input voltage MAIN.

Figure 3B:
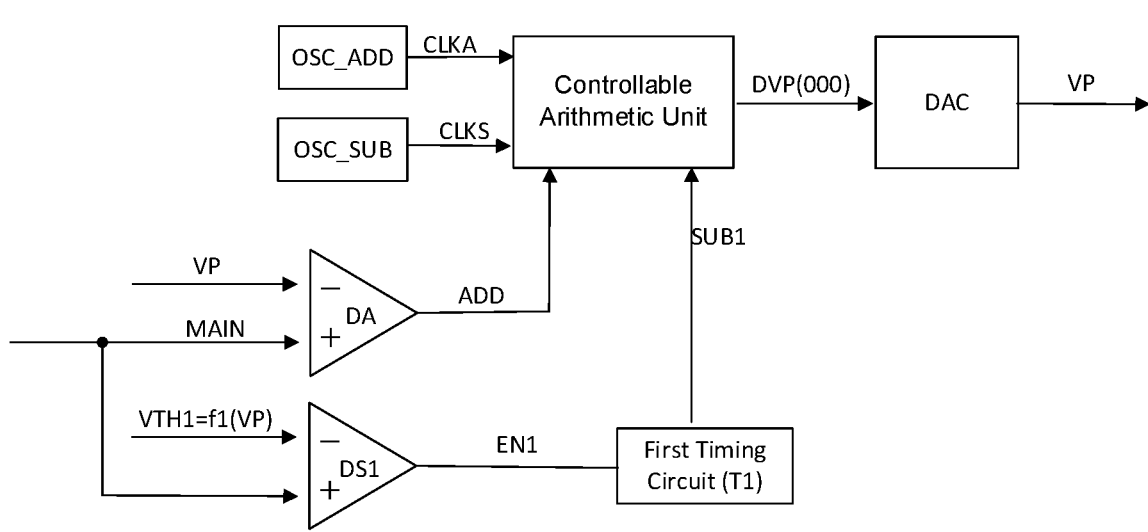
FIG. 3B illustrates a schematic circuit diagram of a peak detecting circuit 302 according to another embodiment of the present invention.

FIG. 3B illustrates a schematic circuit diagram of a peak detecting circuit 302 according to another embodiment of the present invention. The peak detecting circuit 302 may comprise a first oscillator OSC_ADD, a second oscillator OSC_SUB, a first comparator DA, a second comparator DS1, a controllable arithmetic unit, a first timing circuit, and a digital-to-analog converter DAC. The first oscillator OSC_ADD generates an addition clock signal CLKA to the controllable arithmetic unit. The first comparator DA has a first input terminal to receive the input voltage MAIN, a second input terminal to receive the indication signal VP, and an output terminal to output an addition signal ADD to the controllable arithmetic unit. Wherein if the input voltage MAIN is greater than the indication signal VP, the addition signal ADD is in a first state, and if the input voltage MAIN is smaller than the indication signal VP, the addition signal ADD is in a second state. The second comparator DS1 has a first input terminal to receive the input voltage MAIN, a second input terminal to receive the first reference signal VTH1, and an output terminal to output the first enable signal EN1 to the controllable arithmetic unit, wherein when the input voltage MAIN is smaller than the first reference signal VTH1, the first enable signal EN1 is in a first state, and wherein when the input voltage MAIN is greater than the first reference signal VTH1, the first enable signal EN1 is in a second state. The first timing circuit receives the first enable signal EN1 and generates a first subtraction signal SUB1 to the controllable arithmetic unit based on the first enable signal EN1, wherein if the first enable signal EN1 is in the first state for a time longer than the first time duration T1, the first subtraction signal SUB1 transits to the first state. The controllable arithmetic unit receives the addition signal ADD and the first subtraction signal SUB1, and outputs an indication digital signal DVP. When the addition signal ADD is in the first state, the indication digital signal DVP may be increased by one at each valid edge of the addition clock signal CLKA. When the first subtract signal SUB1 is in the first state, the indication digital signal DVP may be decreased by one at each valid edge of the subtraction clock signal CLKS. In an embodiment, the indication digital signal DVP is an N-bit digital signal, the resolution of the indication signal VP is determined by N, and N is a natural number greater than or equal to one. The digital-to-analog circuit DAC receives the indication digital signal DVP and converts it to the indication signal VP.

Figure 4:
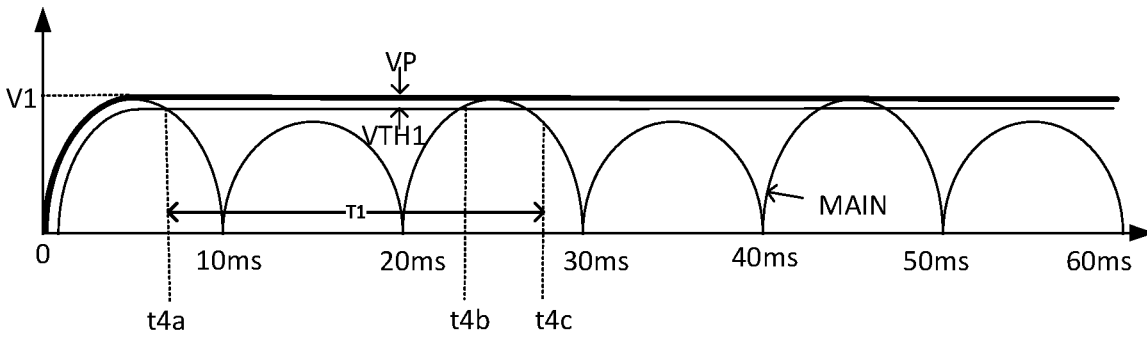
FIG. 4 illustrates a waveform diagram of the indication signal VP and the first reference signal VTH1 when there is a disturbance value ΔV between the peak values of two successively adjacent periods of the input voltage MAIN according to an embodiment of the present invention.
Figure 5:
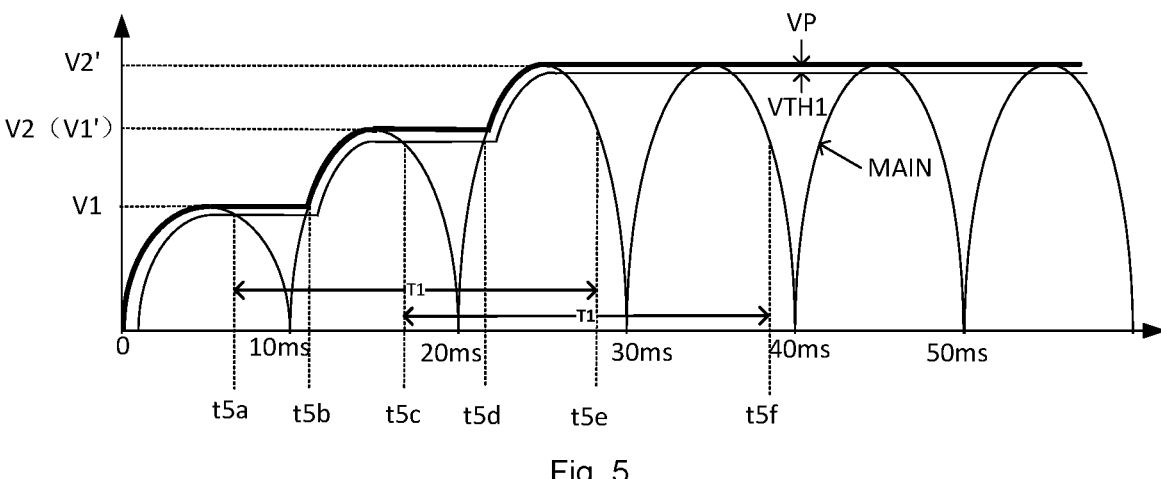
FIG. 5 illustrates a waveform diagram of the indication signal VP and the first reference signal VTH1 when the input voltage MAIN increases according to an embodiment of the present invention.
Figure 6:
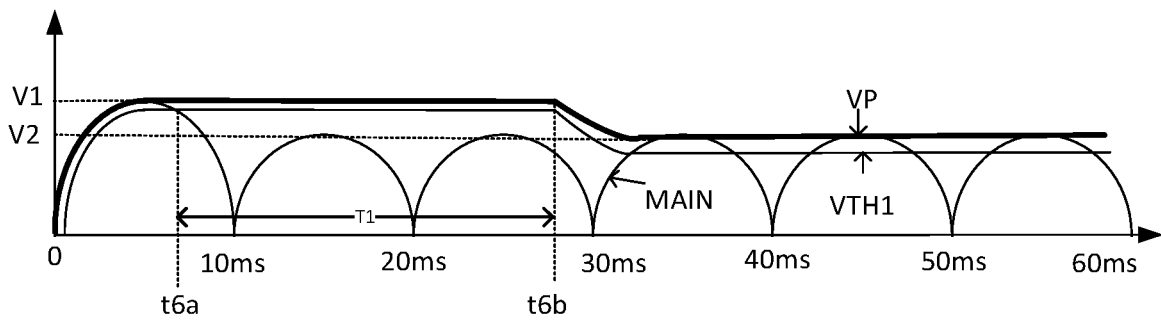
FIG. 6 illustrates a waveform diagram of the indication signal VP and the first reference signal VTH1 when the input voltage MAIN decreases according to an embodiment of the present invention.

FIGS. 4-6 illustrate a waveform plots of the indication signal VP and the first reference signal VTH1 when the input voltage MAIN varies in different cases according to an embodiment of the present invention. In FIGS. 4-6, the input voltage MAIN is a periodic signal with a period T of 10 ms and has a peak value at each period. The indication signal VP is generated based on the input voltage MAIN, and has a first value V1 indicative of the peak value of the input voltage MAIN during a sampling interval. The first reference signal VTH1 may be generated based on the indication signal VP, wherein the first reference signal VTH1 is smaller than the indication signal VP, and the first time duration T1 is longer than twice of the period T of the input voltage MAIN, i.e., T1>2T.

FIG. 4 illustrates a waveform diagram of the indication signal VP and the first reference signal VTH1 when there is a disturbance value ΔV between the peak values of two successively adjacent periods of the input voltage MAIN according to an embodiment of the present invention. In FIG. 4, assuming the period T from 0 to 10 ms is the sampling interval, the indication signal VP is generated based on the input voltage and has a first value V1 indicating the peak value of the input voltage MAIN during the sampling interval. During the first time duration T1 beginning from the moment (e.g. moment t4*a*) when the input voltage MAIN is decreased to the first reference signal VTH1 (i.e. from the moment t4*a* to the moment t4*c*), since the input voltage MAIN is equal to the first reference signal VTH1 at moment t4*b* and the peak value of the input voltage MAIN at the next period (e.g. the period from 20 ms-30 ms) after the first time duration T1 is equal to the first value V1, the indication signal VP is maintained at the first value V1.

FIG. 5 illustrates a waveform diagram of the indication signal VP and the first reference signal VTH1 when the input voltage MAIN increases according to an embodiment of the present invention. In FIG. 5, assuming that the period from 0 to 10 ms is the sampling interval, the indication signal VP is generated based on the peak value of the input voltage MAIN and has a first value V1 indicating the peak value of the input voltage MAIN during the sampling interval. In FIG. 5, at the moment t5a, the input voltage MAIN is decreased to the first reference signal VTH1, and within the first time duration T1 from the moment when the input voltage MAIN is decreased to the first reference signal VTH1 (the moment t5a), i.e., from the moment t5a to the moment t5e, the input voltage MAIN is equal to the first reference signal VTH1 again at the moment t5b, the indication signal VP is increased from the first value V1 to a second value V2, wherein the second value V2 indicating the peak value of the input voltage MAIN at the first period T after the first time duration T1. Repeating the above operation at the next cycle of the input voltage MAIN (cycle from 10 ms to 20 ms), the indication signal VP will be increased from the first value V1' to the second value V2', wherein the first value V1' is indicative of the peak of the input voltage MAIN during the sampling interval from 10 ms to the 20 ms. The second value V2' is indicative of the peak value of the input voltage MAIN at the first period T after the first time duration T1.

FIG. 6 illustrates a waveform diagram of the indication signal VP and the first reference signal VTH1 when the input voltage MAIN decreases according to an embodiment of the present invention. Assuming the period of 0ms to 10 ms as the sampling interval, the indication signal VP is generated based on the input voltage MAIN and has the first value V1 indicating the peak value of the input voltage MAIN during the sampling interval from 0ms to 10 ms. During the first time duration T1 beginning from the moment (moment t6a) when the input voltage MAIN is decreased to the first reference signal VTH1 (i.e. from moment t6a to moment t6b), since the input voltage MAIN is consistently smaller than the first reference signal VTH1, the indication signal VP is decreased from the first value V1 after the first time duration T1. In FIG. 6, the indication signal VP is decreased from the first value V1 to the second value V2, wherein the second value V2 is indicative of the peak value of the input voltage MAIN at the first period T after the first time duration T1.

Figure 7:
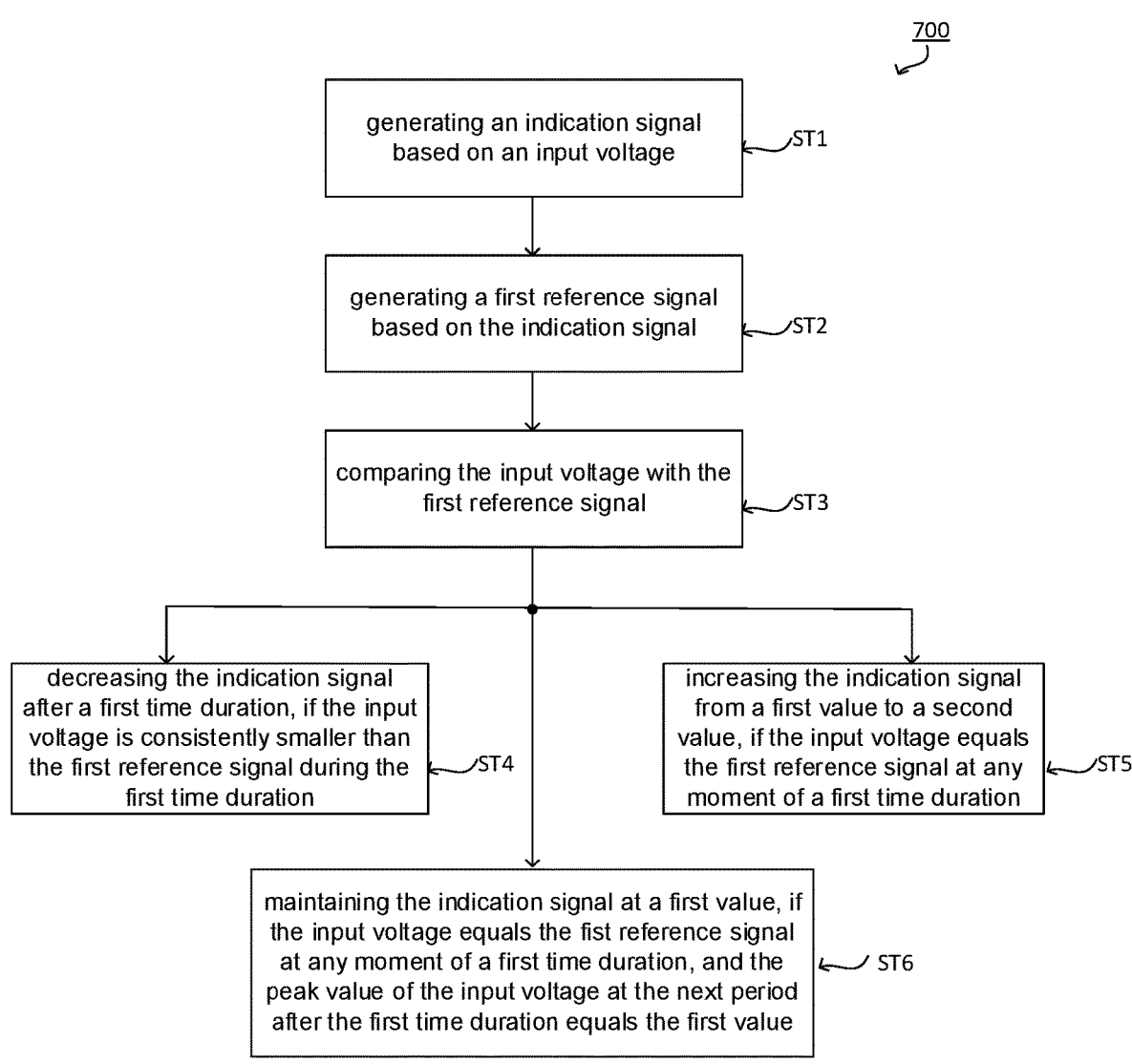
FIG. 7 illustrates a method 700 for detecting an input voltage according to an embodiment of the present invention.

FIG. 7 illustrates a method 700 for detecting an input voltage according to an embodiment of the present invention. The method 700 may comprise steps ST1-ST6 and will be described in conjunction with the peak detecting circuit 301 shown in FIG. 3A and the peak detecting circuit 302 shown in FIG. 3B for a better understanding. The input voltage MAIN has a period T and has a peak value at each period. In step ST1, generating an indication signal VP based on an input voltage MAIN, wherein the indication signal VP has a first value V1 indicating the peak value of the input voltage MAIN during a sampling interval. In an embodiment, the input voltage MAIN is an asymmetric periodic signal, and the sampling interval is defined to be equal to the period T. In step ST2, generating a first reference signal VTH1 based on the indication signal VP, wherein the first reference signal VTH1 is smaller than the indication signal VP. In an embodiment, the indication signal VP and the first reference signal VTH1 have a voltage difference from 5 mV to 100 mV. In step ST3, comparing the input voltage MAIN with the first reference signal VTH1. In step ST4, if the input voltage MAIN is consistently smaller than the first reference signal VTH1 during a first time duration T1 beginning from the moment when the input voltage MAIN is decreased to the first reference signal VTH1, the indication signal VP is decreased after the first time duration T1. In an embodiment, if the input voltage MAIN is consistently smaller than the first reference signal VTH1 during the first time duration T1 beginning from the moment when the input voltage MAIN is decreased to the first reference signal VTH1, the indication signal VP is decreased from the first value V1 to the second value V2 after the first time duration T1, wherein the first value V1 is indicative of the peak value of the input voltage MAIN during the sampling interval, and the second value V2 is indicative of the peak value of the input voltage MAIN during the first period T after the first time duration T1. In step ST5, if the input voltage MAIN is equal to the first reference signal VTH1 at any moment during the first time duration T1 beginning from the moment when the input voltage MAIN is decreased to the first reference signal VTH1, increasing the indication signal VP. In one embodiment, if the input voltage MAIN is equal to the first reference signal VTH1 at any moment during the first time duration T1 beginning from the moment when the input voltage MAIN is decreased to the first reference signal VTH1, the indication signal VP may be increased from the first value V1 to the second value V2, wherein the first value V1 is indicative of the peak value of the input voltage MAIN during the sampling interval, and the second value V2 is indicative of the peak value of the input voltage MAIN at the first period T after the first time duration T1. The first time duration T1 is longer than twice of the period T of the input voltage MAIN, i.e. T1>2T. In step ST6, if the input voltage MAIN is equal to the first reference signal VTH1 at any moment during the first time duration T1 beginning from the moment when the input voltage MAIN is decreased to the first reference signal VTH1, and the peak value of the input voltage MAIN at the next period T after the first time duration T1 is equal to the first value V1, maintaining the indication at the first value V1.

Figure 8A:
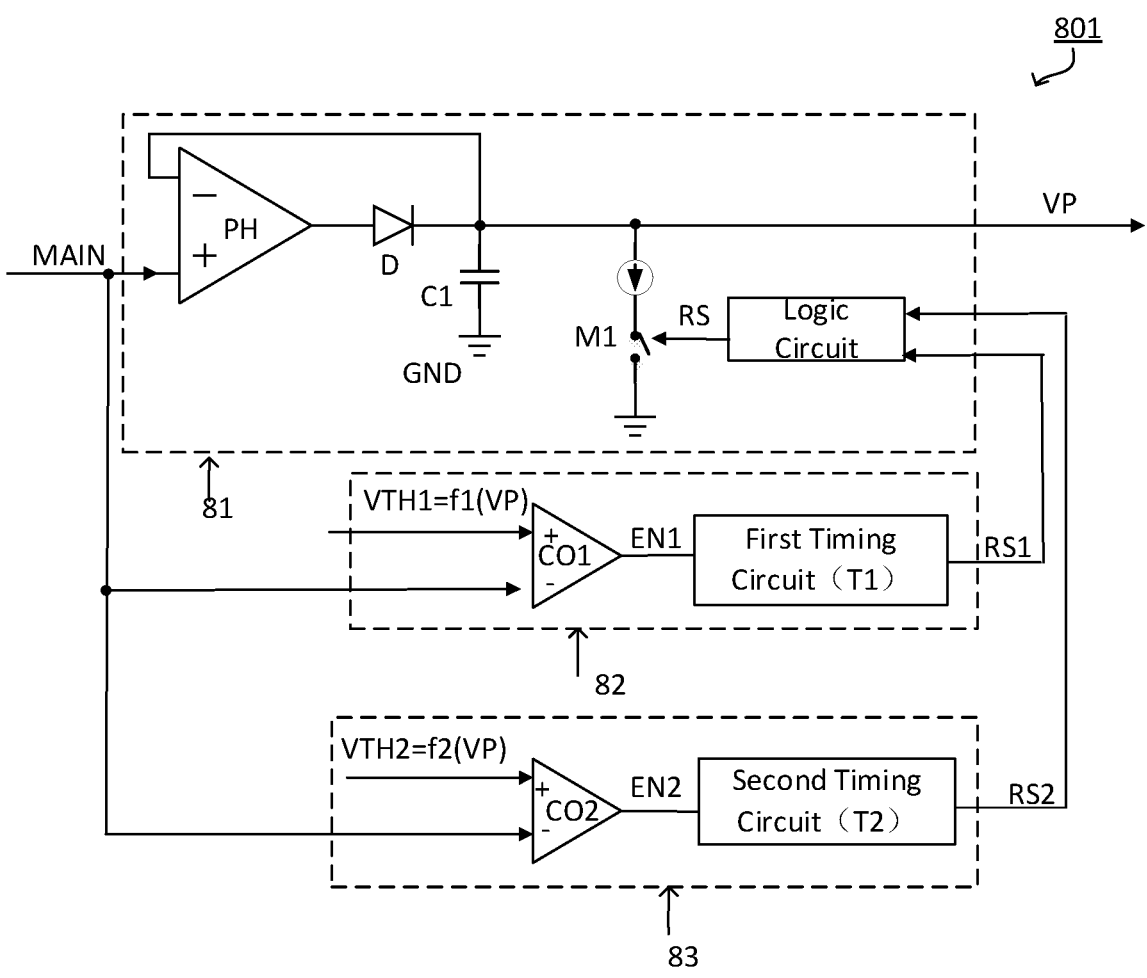
FIG. 8A illustrates a circuit diagram of a peak detecting circuit 801 according to an embodiment of the present invention.

FIG. 8A illustrates a circuit diagram of a peak detecting circuit 801 according to an embodiment of the present invention. Compared with the peak detecting circuit 301 shown in FIG. 3A, the peak detecting circuit 801 shown in FIG. 8A may further comprise a second adjusting circuit 83 and a logic circuit. The second adjusting circuit 83 receives the input voltage MAIN and a second reference signal VTH2 and generates a second adjusting signal RS2 to the sampling and holding circuit 81 to adjust the indication signal VP based on the input voltage MAIN and the second reference signal VTH2. In FIG. 8A, the second adjusting circuit 83 may comprise a second comparator CO2 and a second timing circuit, the second comparator CO2 receives a second enable signal EN2 and outputs a second adjusting signal RS2. The logic circuit receives the first adjusting signal RS1 and the second adjusting signal RS2 and generates an adjusting signal RS based on the first adjusting signal RS1 and the second adjusting signal RS2. In an embodiment, when the first adjusting signal RS1 is in a first state or the second adjusting signal RS2 is in a first state, the adjusting signal RS is in a first state and the controlled switch M1 is controlled to be switched on. The operation principles of the sampling and holding circuit 81 and the first adjusting circuit 82 are the same as the operation principles of the sampling and holding circuit 31 and the first adjusting circuit 32 shown in FIG. 3A, not described repeatedly here for brevity. When the input voltage MAIN is smaller than the second reference signal VTH2, the second enable signal EN2 is in a first state, and when the input voltage MAIN is greater than the second reference signal VTH2, the second enable signal EN2 is in a second state. When the input voltage MAIN is decreased to the second reference signal VTH2, the second enable signal EN2 transits to the first state, and the second timing circuit times the second enable signal EN2. If the second enable signal EN2 is in the first state for a time longer than the second time duration T2, the second adjusting signal RS2 transits to the first state, thus the controlled switch M1 is controlled to be switched on, and the indication signal VP is decreased. If the second enable signal EN2 is in the first state for a time shorter than the second time duration T2, the second adjusting signal RS2 stays in the second state and the indication signal VP stays unchanged, wherein the second reference signal VTH2 is smaller than the first reference signal VTH1. In an embodiment, the second reference signal VTH2 is greater than the disturbance value $\Delta V$ of the input voltage MAIN. The second time duration T2 is longer than the period T of the input voltage MAIN and is shorter than twice of the period T of the input voltage MAIN, i.e. T<T2<2T.

Figures 8B, 9:
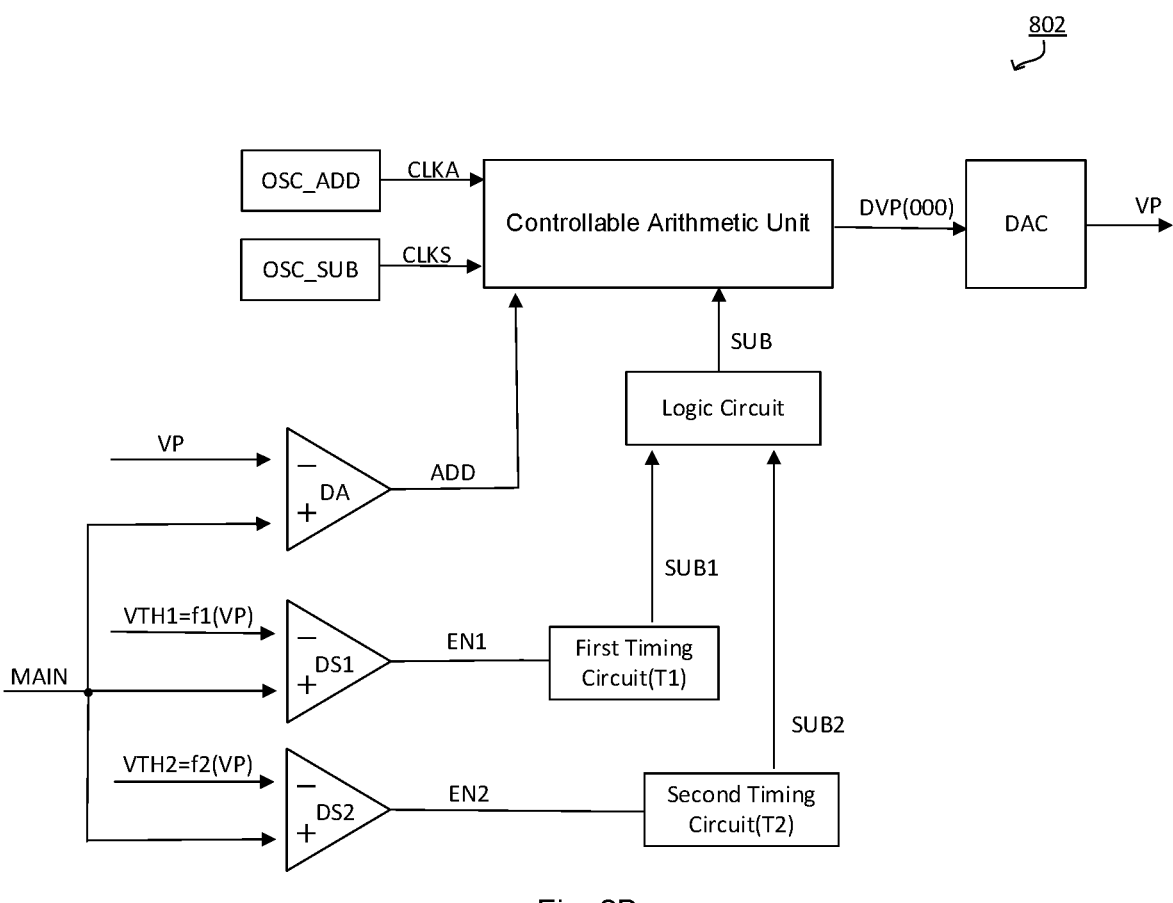
FIG. 8B illustrates a circuit diagram of the peak detecting circuit 802 according to an embodiment of the present invention.
FIG. 9 illustrates a waveform diagram of the indication signal VP, the first reference signal VTH1 and the second reference signal VTH2 when the input voltage MAIN has a disturbance according to an embodiment of the present invention.

FIG. 8B illustrates a circuit diagram of the peak detecting circuit 802 according to an embodiment of the present invention. Compared with the peak detecting circuit 302 shown in FIG. 3B, the peak detecting circuit 802 shown in FIG. 8B may further comprise a second comparator DS2, a second timing circuit and a logic circuit. The operation of the first comparator DS1 and the first timing circuit can be referred to the description of the peak detecting circuit 302 shown in FIG. 3B, and will not be repeated here for the sake of brevity. The second comparator DS2 has a first input terminal to receive the input voltage MAIN and a second input terminal to receive the second reference signal VTH2, and generates the second enable signal EN2 by comparing the input voltage MAIN with the second reference signal VTH2, wherein when the input voltage MAIN is smaller than the second reference signal VTH2, the second enable signal EN2 is in the first state, and when the input voltage MAIN is greater than the second reference signal VTH2, the second enable signal EN2 is in the first state. The second timing circuit times the second enable signal EN2 and generates a second subtraction signal SUB2 based on the second enable signal EN2, and if the second enable signal EN2 is in the first state for a time longer than the second time duration T2, the second subtraction signal SUB2 transits to the first state. The logic circuit receives the first subtraction signal SUB1 and the second subtraction signal SUB2 and generates a subtraction signal SUB according to the first subtraction signal SUB1 and the second subtraction signal SUB2, wherein the subtraction signal SUB is in a first state when the first subtraction signal SUB1 is in the first state or the second subtraction signal SUB2 is in the first state. When the subtraction signal SUB is in the first state, the controllable arithmetic unit controls the indication digital signal DVP may be decreased by one at each valid edge of the subtraction clock signal CLKS.

Figure 10:
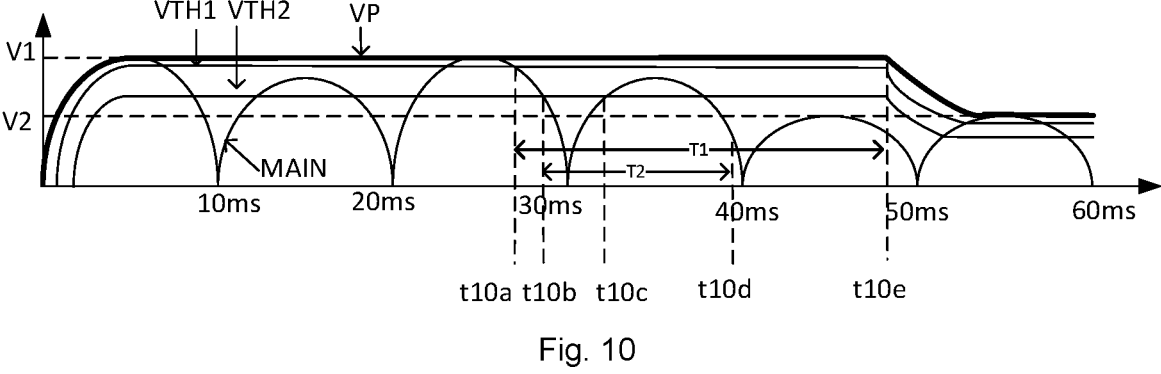
FIG. 10 illustrates a waveform diagram of the indication signal VP, the first reference signal VTH1 and the second reference signal VTH2 when the input voltage MAIN decreases according to an embodiment of the present invention.
Figure 11:
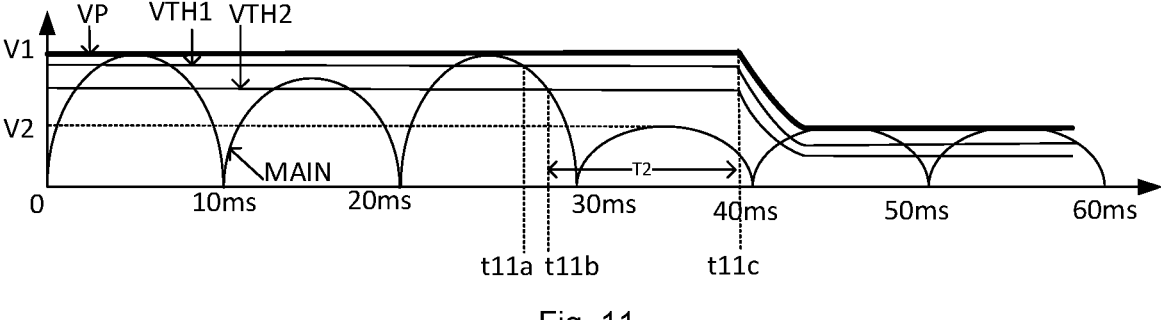
FIG. 11 illustrates a waveform diagram of the indication signal VP, the first reference signal VTH1 and the second reference signal VTH2 when the input voltage MAIN decreases according to another embodiment of the present invention.

FIGS. 9-11 illustrates waveform plots of the indication signal VP, the first reference signal VTH1 and the second reference signal VTH2 when the input voltage MAIN is in different conditions according to an embodiment of the present invention. In FIGS. 9-11, the input voltage MAIN is an asymmetric periodic signal with a period T of 10 ms, wherein the indication signal VP is generated based on the input voltage MAIN, the first reference signal VTH1 is generated based on the indication signal VP, the first reference signal VTH1 is smaller than the indication signal VP, and the second reference signal VTH2 is smaller than the first reference signal VTH1. Wherein the first time duration T1 is longer than twice of the period T of the input voltage MAIN, the second time duration T2 is longer than the period T of the input voltage MAIN and shorter than twice of the period T of the input voltage MAIN, i.e. T<T2<2T<T1. In one embodiment, the first reference signal VTH1 is 10 mV smaller than the indication signal VP. In another embodiment, the first reference signal VTH1 and the indication signal VP have a voltage difference between 5 mV and 100 mV. In one embodiment, the second reference signal VTH2 is adjustable. In another embodiment, the second reference signal VTH2 is set depending on the disturbance value $\Delta V$ of the input voltage MAIN, the second reference signal VTH2 is greater than the disturbance value $\Delta V$ of the input voltage MAIN.

FIG. 9 illustrates a waveform diagram of the indication signal VP, the first reference signal VTH1 and the second reference signal VTH2 when the input voltage MAIN has a distribution value $\Delta V$ according to an embodiment of the present invention. In FIG. 9, assuming the period from 0 to 10 ms is the sampling interval, the indication signal VP is generated based on the input voltage MAIN, the indication signal VP has a first value V1 indicating the peak value of the input voltage MAIN during the sampling interval from Oms to 10 ms. At the moment t9a, the input voltage MAIN is decreased to the first reference signal VTH1, at the moment t9b, the input voltage MAIN is decreased to the second reference signal VTH2, and during the second time duration T2 from the moment when the input voltage MAIN is decreased the second reference signal VTH2 (i.e. from the moment t9b to the moment t9d), the input voltage MAIN is equal to the second reference signal VTH2 at the moment t9c, and the peak value of the input voltage MAIN at the next period T after the second time duration T2 is equal to the peak value of the input voltage MAIN at the sampling interval, so the indication signal VP is maintained at the first value V1. During the first time duration T1 beginning from the moment when the input voltage MAIN is decreased to the first reference signal VTH1 (i.e. from the moment t9a to the moment t9f), since the input voltage MAIN is equal to the first reference signal VTH1 at the moment t9e, and the peak value of the input voltage MAIN at the next period T after the first time duration T1 is equal to the first value V1, the indication signal VP maintains at the first value V1.

FIG. 10 illustrates a waveform diagram of the indication signal VP, the first reference signal VTH1 and the second reference signal VTH2 when the input voltage MAIN decreases according to an embodiment of the present invention. In FIG. 10, the input voltage MAIN has the same peak value during the period of 0-10 ms and the period of 10 ms-20 ms, the indication signal VP is maintained at the first value V1, and its working principle is the same as shown in FIG. 9, which is not repeatedly described here. Assuming that the period from 20 ms to 30 ms is the sampling interval, at the moment t10a, the input voltage MAIN is decreased to the first reference signal VTH1, and at the moment t10b, the input voltage MAIN is decreased to the second reference signal VTH2. In the second time duration T2 from the moment when the input voltage MAIN is decreased to the second reference signal VTH2 (i.e. from the moment t10b to the moment t10d), since the input voltage MAIN is equal to the second reference signal VTH2 at the moment t10c, the indication signal VP is maintained at the first value V1. During the first time duration T1 from the moment when the input voltage MAIN is decreased to the first reference signal VTH1 (i.e. from moment t10a to moment t10e), since the input voltage MAIN is consistently smaller than the second reference signal VTH2, the indication signal VP is decreased after the first time duration T1, i.e. the indication signal VP is decreased at the moment t10e. In FIG. 10, the indication signal VP is decreased until it is equal to the input voltage MAIN and is maintained at a second value V2, wherein the second value V2 is indicative of the peak value of the input voltage MAIN at the first period T after the first time duration T1.

Figure 12:
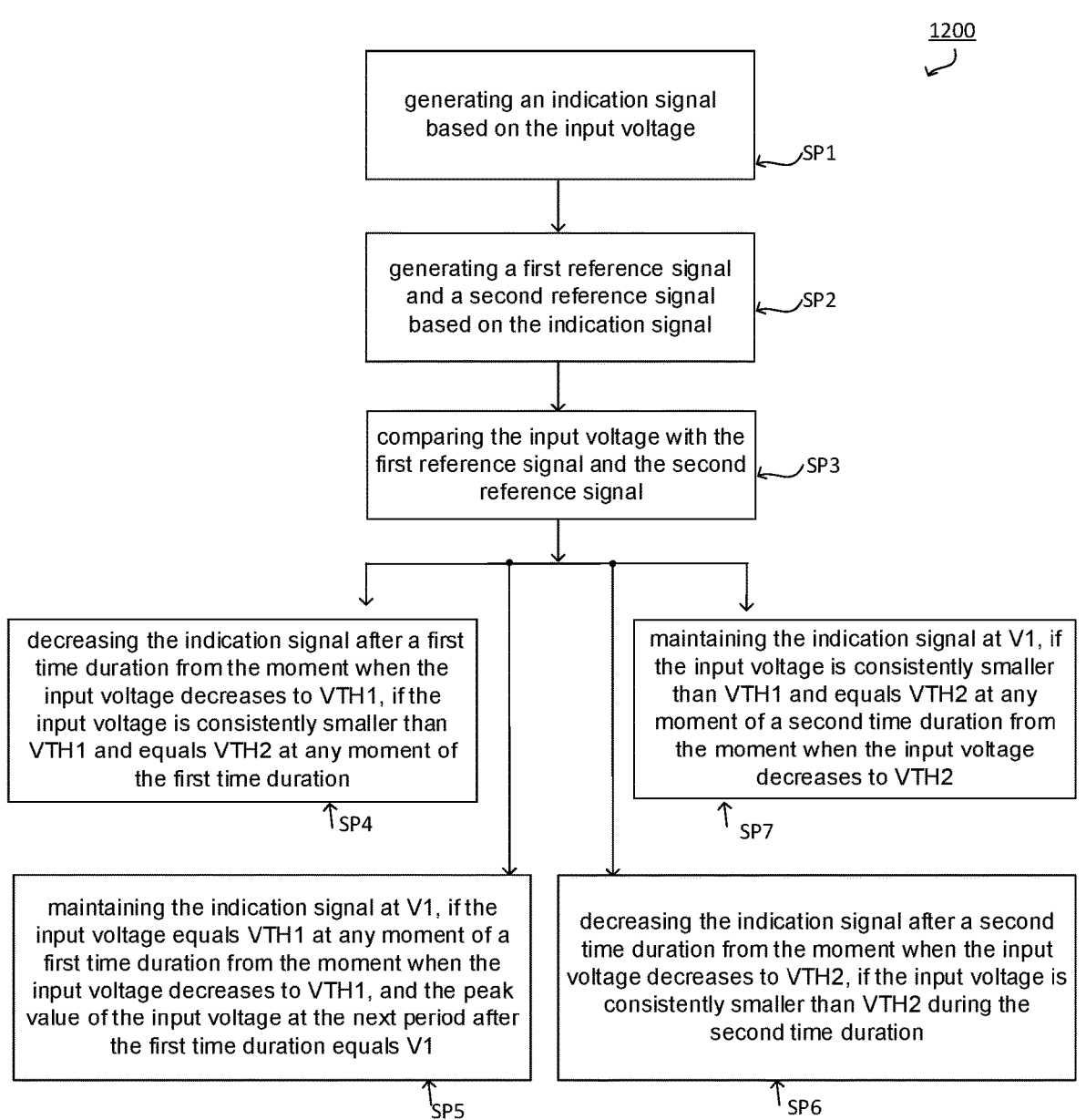
FIG. 12 illustrates a method 1200 for detecting a variation in the peak value of the input voltage MAIN according to an embodiment of the present invention.

FIG. 11 illustrates a waveform diagram of the indication signal VP, the first reference signal VTH1 and the second reference signal VTH2 when the input voltage MAIN decreases according to another embodiment of the present invention. In FIG. 11, assuming the period from 0 to 10 ms is the sampling interval, the indication signal VP is generated based on the input voltage MAIN, the indication signal VP has a first value V1 indicating the peak value of the input voltage MAIN during the sampling interval (Oms to 10 ms). At the moment t11a, the input voltage MAIN is decreased to the first reference signal VTH1, at the moment t11b, the input voltage MAIN is decreased to the second reference signal VTH2, and during the second duration T2 from the moment when the input voltage MAIN is decreased to the second reference signal VTH2 (i.e., from moment t11b to moment t11c), since the input voltage MAIN is consistently smaller than the second reference signal VTH2, the indication signal VP is decreased after the second time duration T2 (i.e., at the moment t11c). In FIG. 12, the indication signal VP is decreased until it is equal to the input voltage MAIN and is maintained at a second value V2, wherein the second value V2 is indicative of the peak value of the input voltage MAIN at the first period T after the second time duration T2.

FIG. 12 illustrates a method 1200 for detecting a variation in the peak value of the input voltage MAIN according to an embodiment of the present invention. The method 1200 may comprise steps SP1-SP7, and the method 1200 is described with reference to the peak detecting circuit 801 shown in FIG. 8A and the peak detecting circuit 802 shown in FIG. 8B for a better understanding. The input voltage MAIN has a period T and has a peak value at each period. In step SP1, generating an indication signal VP based on an input voltage MAIN, wherein the indication signal VP has a first value V1 indicating the peak value of the input voltage MAIN during a sampling interval. In an embodiment, the input voltage MAIN is an asymmetric periodic signal. In an embodiment, the input voltage MAIN is a periodic signal with a period of 10 ms and a peak value of 110V or 220V. In step SP2, generating a first reference signal VTH1 and a second reference signal VTH2 based on the indication signal VP, wherein the first reference signal VTH1 is smaller than the indication signal VP and the second reference signal VTH2 is smaller than the first reference signal VTH1. In step SP3, comparing the input voltage MAIN with the first reference signal VTH1 and the second reference signal VTH2. In step SP4, if the input voltage MAIN is consistently smaller than the first reference signal VTH1 during a first time duration T1 beginning from the moment when the input voltage MAIN is decreased to the first reference signal VTH1, decreasing the indication signal VP after the first time duration. In an embodiment, the step of decreasing the indication signal VP may comprise decreasing the indication signal VP from the first value V1 to a second value V2, wherein the first value V1 is indicative of the peak value of the input voltage MAIN during a sampling interval and the second value V2 is indicative of the peak value of the input voltage MAIN at the first period T after the first time duration T1. In step SP5, if the input voltage MAIN is equal to the first reference signal VTH1 at any moment during the first time duration T1 from the moment when the input voltage MAIN is decreased to the first reference signal VTH1, and the peak value of the input voltage MAIN at the next period T after the first time duration T1 is equal to the first value V1, maintaining the indication signal VP at the first value V1, wherein the first value V1 is indicative of the peak value of the input voltage MAIN during the sampling interval. In step SP6, if the input voltage MAIN is consistently smaller than the second reference signal VTH2 during the second time duration T2 from the moment when the input voltage MAIN is decreased to the second reference signal VTH2, decreasing the indication signal VP from the first value V1 to a second value V2 after the second time duration T2, wherein the first value V1 is indicative of the peak value of the input voltage MAIN during the sampling interval, and the second value V2 is indicative of the peak value of the input voltage MAIN at the first period T after the second time duration T2. In step SP7, during the second time duration T2 from the moment when the input voltage MAIN is decreased to the second reference signal VTH2, if the input voltage MAIN is consistently smaller than the first reference signal VTH1 and is equal to the second reference signal VTH2 at any moment during the second duration T2, the indication signal VP is maintained at the first value V1. Wherein the first time duration T1 is longer than twice of the period T of the input voltage MAIN, i.e. T1>2T, the second time duration T2 is shorter than twice of the period T of the input voltage MAIN and longer than the period T of the input voltage MAIN, i.e. T<T2<2T<T1.

With the peak detecting circuit in the present invention, on one hand, when the input voltage MAIN decreases, the variation in the peak value of the input voltage MAIN may be detected quickly within the second time duration T2, wherein the second time duration T2 is shorter than twice of the period T of the input voltage MAIN. On the other hand, when the input voltage MAIN has a disturbance, the indication signal VP remains unchanged, i.e., the indication signal VP has a higher reliability.

The advantages of the various embodiments of the present invention are not confined to those described above. These and other advantages of the various embodiments of the present invention will become more apparent upon reading the whole detailed descriptions and studying the various FIGS. of the drawings.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments. Accordingly, the present invention is not limited except as by the appended claims.

What is claimed is:

1. A method for detecting an input voltage by using a peak detecting circuit, wherein the input voltage has a plurality of portions, each of the plurality of portions of the input voltage occupies a time duration equal to a period and has a respective peak value, the method comprising:

generating an indication signal based on the input voltage, the indication signal has a first value indicating the peak value of a first one of the plurality of portions of the input voltage;

generating a first reference signal based on the indication signal, wherein the first reference signal is smaller than the indication signal; and adjusting the indication signal by an adjusting circuit comprises a comparator comparing the input voltage with the first reference signal; and wherein decreasing the indication signal after a first time duration beginning from a moment when the input voltage is decreased to the first reference signal, if the input voltage is consistently smaller than the first reference signal during the first time duration, wherein the first time duration is longer than twice of the period of the input voltage.

2. The method of claim 1, the step of decreasing the indication signal comprises decreasing the indication signal from the first value to a second value, wherein the second value is indicative of the peak value of a second one of the plurality of portions of the input voltage following the first time duration.

3. The method of claim 1, further comprising: if the input voltage is greater than the indication signal at any moment during the first time duration beginning from the moment when the input voltage is decreased to the first reference signal, increasing the indication signal.

4. The method of claim 1, further comprising: if the input voltage is equal to the first reference signal at any moment during the first time duration from the moment when the input voltage is decreased to the first reference signal, and the peak value of a second one of the plurality of portions of the input voltage following the first time duration is equal to the first value, maintaining the indication signal at the first value after the first time duration.

5. The method of claim 1, wherein the indication signal and the first reference signal have a voltage difference between 5 mV to 50 mV.

6. A method for detecting an input voltage by using a peak detecting circuit, wherein the input voltage has a plurality of portions, each of the plurality of portions of the input voltage occupies a time duration equal to a period and has a respective peak value, the method comprising:

generating an indication signal based on the input voltage, the indication signal has a first value indicating the peak value of a first one of the plurality of portions of the input voltage;

generating a first reference signal and a second reference signal based on the indication signal, wherein the first reference signal is smaller than the indication signal, and the second reference signal is smaller than the first reference signal; and adjusting the indication signal by an adjusting circuit comprises a comparator comparing the input voltage with the first reference signal and the second reference signal; wherein decreasing the indication signal after a first time duration beginning from a moment when the input voltage is decreased to the first reference signal, if the input voltage is consistently smaller than the first reference signal and is equal to the second reference signal at any moment during the first time duration; and wherein decreasing the indication signal after a second time duration beginning from a moment when the input voltage is decreased to the second reference signal, if the input voltage is consistently smaller than the second reference signal during the second time duration;

wherein the first time duration is longer than twice of the period of the input voltage, the second time duration is longer than the period of the input voltage and shorter than twice of the period of the input voltage.

7. The method of claim 6, wherein the step of decreasing the indication signal after the first time duration comprises: decreasing the indication signal from the first value to a second value, wherein the second value is indicative of the peak value of a second one of the plurality of portions of the input voltage after the first time duration.

8. The method of claim 6, wherein the step of decreasing the indication signal after the second time duration comprises:

decreasing the indication signal from the first value to a second value, wherein the second value is indicative of the peak value of a second one of the plurality of portions of the input voltage after the second time duration.

9. The method of claim 6, further comprising: if the input voltage is greater than the indication signal at any moment during the first time duration from the moment when the input voltage is decreased to the first reference signal, increasing the indication signal.

10. The method of claim 6, further comprising: if the input voltage is equal to the first reference signal at any moment during the first time duration from the moment when the input voltage is decreased to the first reference signal, and the peak value of a second one of the plurality of portions of the input voltage following the first time duration is equal to the first value, maintaining the indication signal at the first value.

11. The method of claim 6, further comprising: if the input voltage is consistently smaller than the first reference signal and is equal to the second reference signal at any moment during the second time duration from the moment when the input voltage is decreased to the second reference signal, maintaining the indication signal at the first value.

12. The method of claim 6, wherein the indication signal and the first reference signal have a voltage difference between 5 mV to 50 mV.

* * * * *